(12) United States Patent
Wang et al.

(10) Patent No.: US 10,718,617 B2
(45) Date of Patent: Jul. 21, 2020

(54) METHOD AND APPARATUS FOR MEASURING POSTURE ANGLE OF OBJECT

(71) Applicant: Goertek Inc., Shandong (CN)

(72) Inventors: Jiudong Wang, Shandong (CN); Bo Li, Shandong (CN); Hui Qi, Shandong (CN)

(73) Assignee: Goertek Inc., Shandong (CN)

( * ) Notice: Subject to any disclaimer, the term of this patent is extended or adjusted under 35 U.S.C. 154(b) by 167 days.

(21) Appl. No.: 15/742,761

(22) PCT Filed: Sep. 13, 2017

(86) PCT No.: PCT/CN2017/101540
§ 371 (c)(1),
(2) Date: Jan. 8, 2018

(87) PCT Pub. No.: WO2018/107831
PCT Pub. Date: Jun. 21, 2018

(65) Prior Publication Data
US 2018/0372497 A1    Dec. 27, 2018

(30) Foreign Application Priority Data

Dec. 14, 2016 (CN) .......................... 2016 1 1152489

(51) Int. Cl.
*G01C 21/08* (2006.01)
*G01R 33/02* (2006.01)
(Continued)

(52) U.S. Cl.
CPC ............. *G01C 21/08* (2013.01); *G01C 21/20* (2013.01); *G01C 25/005* (2013.01); *G01R 33/0206* (2013.01)

(58) Field of Classification Search
CPC ...... G01C 21/08; G01C 21/20; G01C 25/005; G01R 33/0206
(Continued)

(56) References Cited

U.S. PATENT DOCUMENTS 6,820,025 B2 * 11/2004 Bachmann ............ A61B 5/1114
600/595
7,233,872 B2 * 6/2007 Shibasaki ................ A61B 5/11
33/512
(Continued)

FOREIGN PATENT DOCUMENTS

CN        101581583 A    11/2009

OTHER PUBLICATIONS

Bachmann, E.R., McGhee, R.B., Yun, X. and Zyda, M.J., Nov. 2001. Inertial and magnetic posture tracking for inserting humans into networked virtual environments. In Proceedings of the ACM symposium on Virtual reality software and technology (pp. 9-16). ACM. (Year: 2001).*

(Continued)

*Primary Examiner* — Christopher P McAndrew
(74) *Attorney, Agent, or Firm* — Alston & Bird LLP

(57) ABSTRACT

The present invention discloses a method and an apparatus for measuring a posture angle of an object. The method comprises the following steps: arranging a sensor in a measured object, the sensor being used for measuring characteristic quantities of magnetic field in three dimensional directions; actuating the sensor at the beginning of the measurement, and acquiring, by using the sensor, a current measured value of the characteristic quantity of magnetic field of the measured object in a carrier coordinate system; acquiring reference values of the characteristic quantities of magnetic field of the measured object in a geographic coordinate system; and calculating a current posture angle of
(Continued)

the measured object according to numerical values of the characteristic quantities of magnetic field indicated by the reference value and the measured value in each direction respectively.

14 Claims, 2 Drawing Sheets

(51) Int. Cl.
*G01C 21/20* (2006.01)
*G01C 25/00* (2006.01)

(58) Field of Classification Search
USPC .......................................................... 324/244
See application file for complete search history.

(56) References Cited

U.S. PATENT DOCUMENTS

| | | | | |
|---|---|---|---|---|
| 7,377,046 | B2* | 5/2008 | Yamada | G01C 17/28 |
| | | | | 33/355 R |
| 7,525,309 | B2* | 4/2009 | Sherman | G01R 33/0206 |
| | | | | 324/207.13 |
| 7,533,569 | B2* | 5/2009 | Sheynblat | G01C 21/16 |
| | | | | 73/509 |
| 7,826,999 | B1* | 11/2010 | Boeen | G01C 25/005 |
| | | | | 33/352 |
| 10,261,155 | B2* | 4/2019 | Cohen | G01R 33/543 |
| 10,345,411 | B2* | 7/2019 | Grodzki | G01R 33/3854 |
| 10,421,100 | B2* | 9/2019 | Houston | G01D 5/40 |
| 2002/0103610 | A1* | 8/2002 | Bachmann | G01C 21/165 |
| | | | | 702/94 |
| 2007/0163367 | A1* | 7/2007 | Sherman | A61B 90/39 |
| | | | | 73/866 |
| 2009/0254294 | A1* | 10/2009 | Dutta | G01C 17/28 |
| | | | | 702/92 |
| 2011/0106477 | A1* | 5/2011 | Brunner | G06F 3/038 |
| | | | | 702/104 |
| 2011/0149266 | A1* | 6/2011 | Motzer | G01S 5/16 |
| | | | | 356/4.01 |
| 2011/0202300 | A1* | 8/2011 | Udagawa | G01P 21/00 |
| | | | | 702/95 |
| 2012/0136604 | A1* | 5/2012 | Hsieh | G01C 25/005 |
| | | | | 702/93 |
| 2013/0265047 | A1* | 10/2013 | Griswold | G01R 33/56 |
| | | | | 324/309 |
| 2014/0116108 | A1* | 5/2014 | Franke | G01C 25/005 |
| | | | | 73/1.37 |
| 2014/0163870 | A1* | 6/2014 | Riley | G01S 5/0072 |
| | | | | 701/470 |
| 2014/0292328 | A1* | 10/2014 | Brady-Kalnay | G01R 33/4822 |
| | | | | 324/309 |
| 2014/0303478 | A1* | 10/2014 | Roche | G01R 33/5608 |
| | | | | 600/410 |
| 2014/0350881 | A1* | 11/2014 | Hong | G01C 25/005 |
| | | | | 702/95 |
| 2014/0352400 | A1* | 12/2014 | Barrilado | G01P 15/0802 |
| | | | | 73/1.38 |
| 2015/0186606 | A1* | 7/2015 | Kuang | G16B 5/00 |
| | | | | 702/19 |
| 2015/0260544 | A1* | 9/2015 | Cochran | G01C 25/00 |
| | | | | 702/94 |
| 2015/0260545 | A1* | 9/2015 | Yang | G01C 25/005 |
| | | | | 73/1.77 |
| 2015/0272467 | A1* | 10/2015 | Warfield | G01R 33/5608 |
| | | | | 382/131 |
| 2015/0301141 | A1* | 10/2015 | Griswold | G01R 33/5608 |
| | | | | 382/131 |
| 2015/0301142 | A1* | 10/2015 | Griswold | G01R 33/4828 |
| | | | | 324/309 |
| 2015/0346301 | A1* | 12/2015 | Cauley | G01R 33/4828 |
| | | | | 324/309 |
| 2016/0155238 | A1* | 6/2016 | Bachschmidt | A61B 5/743 |
| | | | | 382/131 |
| 2016/0270687 | A1* | 9/2016 | Brady-Kalnay | A61B 5/055 |
| 2016/0282434 | A1* | 9/2016 | Seiberlich | G01R 33/50 |

OTHER PUBLICATIONS

Wong, W.Y. and Wong, M.S., 2008. Trunk posture monitoring with inertial sensors. European Spine Journal, 17(5), pp. 743-753. (Year: 2008).*

Yun, X., Bachmann, E.R. and McGhee, R.B., 2008. A simplified quaternion-based algorithm for orientation estimation from earth gravity and magnetic field measurements. Naval Postgraduate School Monterey CA Dept of Electrical and Computer Engineering. (Year: 2008).*

* cited by examiner

METHOD AND APPARATUS FOR MEASURING POSTURE ANGLE OF OBJECT

CROSS-REFERENCE TO RELATED APPLICATIONS

This application is a National Stage Application, filed under 35 U.S.C. § 371, of International Application No. PCT/CN2017/101540, filed on Sep. 13, 2017, which claims priority to Chinese Patent Application No. 201611152489.X, filed on Dec. 14, 2016, the contents of both of which as are hereby incorporated by reference in their entireties.

BACKGROUND

Related Field

The present invention relates to the field of the technical field of smart products, and in particular, to a method and an apparatus for measuring a posture angle of an object.

Description of Related Art

In many fields, such as virtual reality, balance vehicles, aircrafts or robots, it is necessary to calculate a posture angle of an object or certain component on the object. A gyroscope is generally adopted in combination with an accelerometer in the existing scheme to measure a posture angle.

When the gyroscope is used for measurement, posture data obtained by the gyroscope at a moment is the posture data relative to the previous moment. However, since the data measured by the gyroscope has an offset error, an error of an angle calculated according to reintegration of the data obtained from the gyroscope will continue to accumulate over time, resulting in a larger error during long-time measurement. An accelerometer measures not only gravity but also a specific force, but only gravity data is needed for the calculation of the posture angle; and therefore, the calculated posture angle will have an error in case where the specific force is present and the error will increase with the increase of the specific force.

From the above, the existing scheme requires more hardware, and needs to cooperate with more complex filtering algorithms, thereby causing large calculation quantity and high cost. In addition, the posture angle obtained in the existing scheme will have a larger error with time accumulation and the increase of the specific force, such that the accuracy of the posture angle gets worse.

BRIEF SUMMARY

Embodiments of the present invention provide a method and an apparatus for measuring a posture angle of an object to solve the problems, such as large calculation quantity, high cost and poor accuracy during posture angle measurement in the existing scheme.

In order to achieve said object, the technical solution of the present invention is implemented as follows.

In one aspect, an embodiment of the present invention provides a method for measuring a posture angle of an object. The method comprises the following steps:

Arranging a sensor in a measured object, the sensor being used for measuring characteristic quantities of magnetic field in three dimensional directions;

Actuating the sensor at the beginning of the measurement, and acquiring, by using the sensor, measured values of the characteristic quantities of magnetic field of the measured object in a carrier coordinate system;

Acquiring reference values of the characteristic quantities of magnetic field of the measured object in a geographic coordinate system; and Calculating a current posture angle of the measured object according to numerical values of the characteristic quantities of magnetic field indicated by the reference values and the measured values in each direction respectively.

In another aspect, an embodiment of the present invention provides an apparatus for measuring a posture angle of an object. The apparatus comprises:

A measured value acquisition unit configured to actuate a sensor arranged in the measured object at the beginning of the measurement, and acquire, by using the sensor, a current measured value of a characteristic quantity of magnetic field of the measured object in a carrier coordinate system, the sensor being used for measuring characteristic quantities of magnetic field in three dimensional directions;

A reference value acquisition unit configured to acquire reference values of the characteristic quantity of magnetic field of the measured object in a geographic coordinate system; and A posture angle calculation unit configured to calculate a current posture angle of the measured object according to numerical values of the characteristic quantities of magnetic field indicated by the reference value and the measured value in each direction respectively.

The embodiment of the present invention provides a novel posture angle measurement scheme using magnetic field characteristics of an object, which is used for calculating a posture angle according to a change of the characteristic quantity of magnetic field of a measured object. This scheme only requires the same type of sensors, and data to be processed is of the same type, thereby significantly reducing the hardware cost and the calculation quantity of data. In addition, the scheme requires no gyroscope or accelerometer. The measured data acquired at the present moment is not associated with the measured data at the previous moment and is absolute data, without the influence from the specific force; and therefore, the posture angle of the object can be accurately measured in real time.

BRIEF DESCRIPTION OF THE FIGURES

The accompanying drawings, which are incorporated in and constitute a part of the specification, illustrate embodiments of the invention and, together with the description thereof, serve to explain the principles of the invention.

DETAILED DESCRIPTION OF VARIOUS EMBODIMENTS

In order to make the purposes, technical solutions and advantages of the present invention more apparent, the embodiments of the present invention will be further described in detail below with reference to the accompanying drawings.

Figure 1:
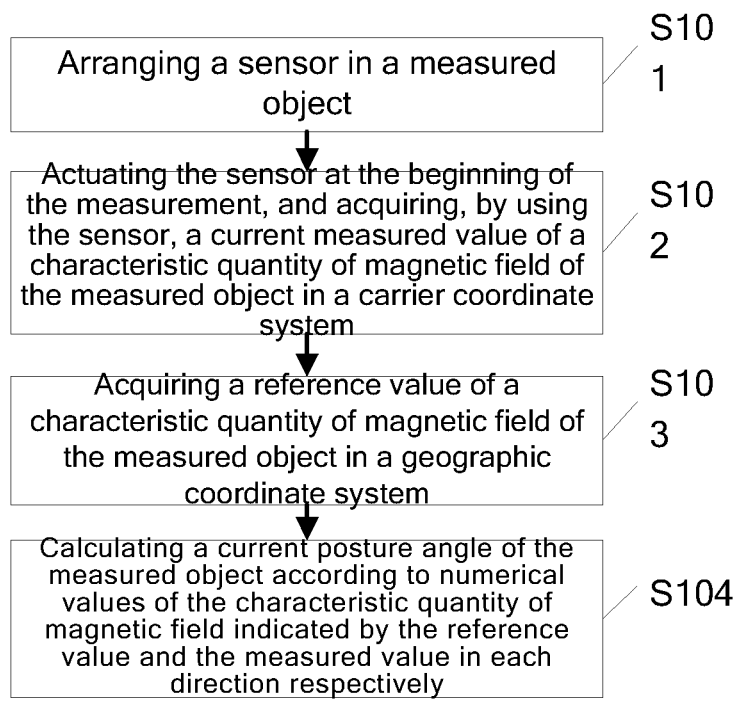
FIG. 1 is a flow diagram of a method for measuring a posture angle of an object provided by an embodiment of the present invention.

A method for measuring a posture angle of an object provided by an embodiment of the present invention may be implemented in a smart terminal. The smart terminal (a measured object) includes, but is not limited to a smart phone, an unmanned aerial vehicle, smart glasses, an HMD (Head Mount Display), or the like. Referring to FIG. 1, the method at least comprises the following steps S101 to S104.

In S101, a sensor is arranged in a measured object, the sensor being used for measuring characteristic quantities of magnetic field in three dimensional directions. This step is not required for each measurement process and may be executed in advance before initial use. Or, this step may be omitted when the sensor having the same or similar function has been arranged in the measured object. The scheme in the present embodiment may be implemented using a sensor already existing in the measured object.

In S102, the sensor is actuated at the beginning of the measurement to acquire a current measured value of the characteristic quantity of magnetic field of the measured object in a carrier coordinate system.

In S103, a reference value of the characteristic quantity of magnetic field of the measured object in a geographic coordinate system is acquired.

The coordinate system formed in the three dimensional directions in S101, the carrier coordinate system in S102, and the geographic coordinate system in S103 may be a three-dimensional Cartesian coordinate system, respectively.

In S104, a current posture angle of the measured object is calculated according to numerical values of the characteristic quantity of magnetic field indicated by the reference value and the measured value in each direction respectively.

Steps S102 to S104 are executed by functional modules inside the measured object or by separate devices outside the measured object. Steps S102 to S104 describe one measurement process. Steps S102 to S104 may be repeated continuously in the movement process of the measured object so as to obtain the posture angle of the measured object at each moment in real time. An execution order of this method is not limited strictly in FIG. 1. For example, steps S102 and S103 may be executed at the same time.

Based on the embodiment shown in FIG. 1, further, the sensor may be arranged in step S101 of yet another embodiment of the present invention according to the following two rules.

In Rule No. 1, the sensor is arranged in the center of mass of the measured object, or the sensor is arranged at a position away from the center of mass of the measured object for not exceeding a first threshold value.

For a scene with high precision requirements or the existence of multiple rotatable components on the measured object, the sensor is arranged near the center of mass of the measured object, which helps to obtain a more stable measurement result and obtain the posture angle of the measured object.

In Rule No. 2, the sensor is arranged at a position away from a magnetic member in the measured object for exceeding a second threshold value.

The sensor in the present embodiment includes, but is not limited to, a magnetometer, and may be other sensing device which has a directional pointing function and by which a measured magnetic value is substantially constant.

Since the present embodiment utilizes the magnetic characteristics of the object, in order to prevent the magnetic field generated by a magnetic member inherent in the measured object from interfering with a measurement result, the sensor is arranged at a position away from a component with stronger magnetic field interference in the measured object, thereby ensuring the accuracy of the measurement result.

For example, when the measured object is an aircraft, a motor in the aircraft usually produces relatively greater electromagnetic interference. The sensor is arranged at a position away from the motor of the aircraft for exceeding the second threshold, i.e., the sensor is arranged at a position away from the motor of the aircraft.

The above two rules may be used at the same time or alternatively.

Further, in the step S102, prior to acquiring, by using the sensor, the current measured value of the characteristic quantity of magnetic field of the measured object in the carrier coordinate system, the method for measuring the posture angle of the object further comprises: calibrating the sensor so as to ensure the accuracy of the measured value.

Further, the step S103 may comprise the following operations S1031-1033.

In S1031, reference values of the characteristic quantities of magnetic field in geographical coordinate systems in different areas are recorded to generate a reference data table.

This scheme may be used to measure the reference values of the characteristic quantities of magnetic field in geographical coordinate systems in different areas in advance, or to obtain the reference values from the existing magnetic field data, e.g., from international geomagnetic reference field data recorded in the State Oceanic Administration or the Atmospheric Administration. The respective areas and the corresponding reference values thereof are recorded in a list to generate a reference data table.

When the characteristic quantity of magnetic field is the magnetic field intensity, a record is generated for the reference values of the magnetic field intensity in three dimensional directions (for example, three directions of East, North and Up) in each area, and the reference data table is obtained from the records of all the areas.

In S1032, an area where the measured object is currently located is confirmed firstly when the reference value needs to be acquired.

The reference values of the characteristic quantities of magnetic field are different in different areas, and therefore the area needs to be confirmed firstly.

In S1033, the reference value of the characteristic quantity of magnetic field of the confirmed area is obtained as the reference value of the measured object by looking up the reference data table according to the confirmed area.

In this step, the area is used as an index amount, and the reference value is obtained by looking up the reference data table.

Further, the step S104 may comprise the following operations S1041-1043.

In S1041, the posture angles to be calculated are selected, including a roll angle, a pitch angle and a yaw angle.

The posture angles refer to spatial azimuths of the object relative to a reference object, usually including a pitch angle, a roll angle and a yaw angle. The present embodiment will be described by, for example, calculating the three types of posture angles at the same time. In some scenes, it is also possible to only calculate one type or two types of posture angles.

In S1042, a transformation matrix is set for the reference values and the measured values by using the three types of posture angles.

Specifically, the transformation matrix $C_t^b$ satisfies the following formula I and formula II:

$$M^b = C_t^b * M^t, \quad \text{formula I}$$

$$C_t^b = \begin{bmatrix} \cos(\theta)*\cos(\varphi) & \cos(\theta)*\sin(\varphi) & -\sin(\theta) \\ \sin(\theta)*\sin(\gamma)*\cos(\varphi) - \sin(\varphi)*\cos(\gamma) & \sin(\theta)*\sin(\gamma)*\sin(\varphi) + \cos(\varphi)*\cos(\gamma) & \cos(\theta)*\sin(\gamma) \\ \sin(\theta)*\cos(\gamma)*\cos(\varphi) + \sin(\varphi)*\sin(\gamma) & \sin(\theta)*\cos(\gamma)*\sin(\varphi) - \cos(\varphi)*\sin(\gamma) & \cos(\theta)*\cos(\gamma) \end{bmatrix}, \quad \text{formula II}$$

in which $M^b$ represents a measured value of the characteristic quantity of magnetic field, $M^t$ represents a reference value of the characteristic quantity of magnetic field, $\gamma$ represents the roll angle, $\theta$ represents the pitch angle, and $\varphi$ represents the yaw angle.

In S1043, during the current measurement process, a posture angle is calculated according to numerical values of the characteristic quantities of magnetic field indicated by the reference value and the measured value in each direction respectively and the transformation matrix.

When x, y, z are used to represent the numerical values of the characteristic quantities of magnetic field in the three dimensional directions, $M^b$ is represented as $M^b=[x^b, y^b, z^b]$, $M^t$ is represented as $M^t=[x^t, y^t, z^t]$, and then the following relation may be obtained:

$$\begin{cases} x^b = \cos(\theta)*\cos(\varphi)*x^t + \cos(\theta)*\sin(\varphi)*y^t - \sin(\theta)*z^t \\ y^b = [\sin(\theta)*\sin(\gamma)*\cos(\varphi) - \sin(\varphi)*\cos(\gamma)]*x^t + [\sin(\theta)*\sin(\gamma)*\sin(\varphi) + \cos(\varphi)*\cos(\gamma)]*y^t + \cos(\theta)*\sin(\gamma)*z^t \\ z^b = [\sin(\theta)*\cos(\gamma)*\cos(\varphi) + \sin(\varphi)*\sin(\gamma)]*x^t + [\sin(\theta)*\cos(\gamma)*\sin(\varphi) - \cos(\varphi)*\sin(\gamma)]*y^t + \cos(\theta)*\cos(\gamma)*z^t \end{cases}$$

Accordingly, the roll angle, the pitch angle and the yaw angle may be calculated according to the reference values and the measured values.

Figure 2:
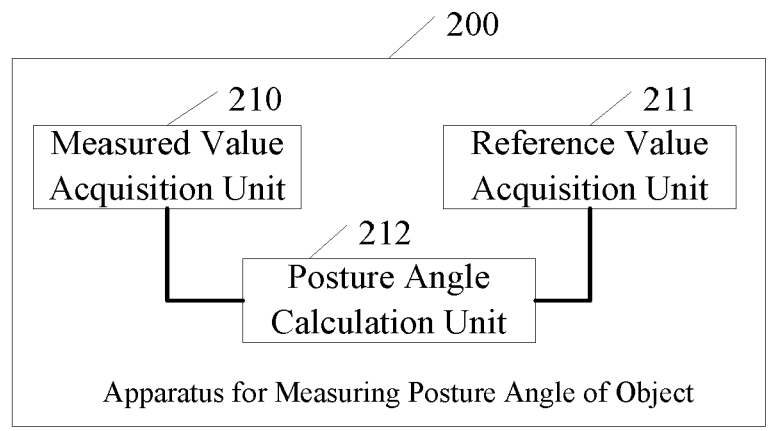
FIG. 2 is a schematic structural diagram of an apparatus for measuring a posture angle of an object provided by another embodiment of the present invention.

Another embodiment of the present invention provides an apparatus 200 for measuring a posture angle of an object. Referring to FIG. 2, the apparatus 200 at least comprises a measured value acquisition unit 210, a reference value acquisition unit 211 and a posture angle calculation unit 212.

The measured value acquisition unit 210 is configured to actuate a sensor arranged in the measured object at the beginning of the measurement, and acquire, by using the sensor, a current measured value of a characteristic quantity of magnetic field of the measured object in a carrier coordinate system, the sensor being used for measuring characteristic quantities of magnetic field in three dimensional directions, and optionally, the sensor being calibrated prior to measuring using the sensor.

The reference value acquisition unit 211 is configured to acquire reference values of the characteristic quantities of magnetic field of the measured object in a geographic coordinate system.

The posture angle calculation unit 212 is configured to calculate a current posture angle of the measured object according to numerical values of the characteristic quantities of magnetic field indicated by the reference value and the measured value in each direction respectively.

The sensor in the apparatus 200 includes, but is not limited to, a magnetometer, and the measured characteristic quantities of magnetic field include, but are not limited to, numerical values of the magnetic field intensity in three dimensional directions.

Based on the embodiment shown in FIG. 2, further, the sensor is arranged in the apparatus 200 in another embodiment of the present invention. The apparatus 200 is mounted in the measured object, and therefore the sensor is arranged in the measured object. When the apparatus 200 is mounted, the above two rules may be referred to at the same time or alternatively.

Figure 3:
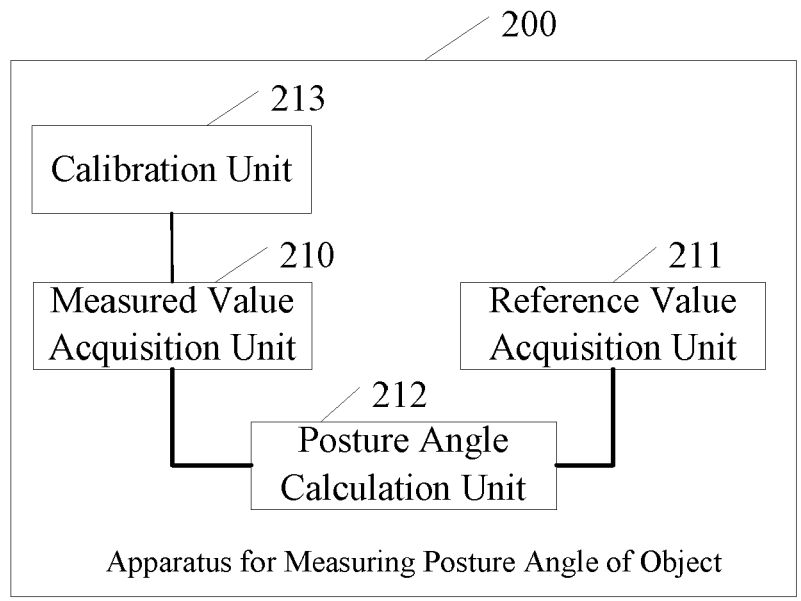
FIG. 3 is a schematic structural diagram of an apparatus for measuring a posture angle of an object provided by yet another embodiment of the present invention.

Referring to FIG. 3, the apparatus further comprises: a calibration unit 213 specifically configured to calibrate the sensor, prior to acquiring, by using the sensor, the current measured value of the characteristic quantity of magnetic field of the measured object in a carrier coordinate system. In this way, the accuracy of the measured value may be ensured.

Further, the reference value acquisition unit 211 is configured to: record reference values of the characteristic quantities of magnetic field in geographical coordinate systems in different areas to generate a reference data table; confirm an area where the measured object is currently located when the reference value needs to be acquired; look up the reference data table according to the confirmed area, and obtain the reference value of the characteristic quantity of magnetic field of the confirmed area as the reference value of the measured object;

The posture angle calculation unit 212 is configured to: select the posture angles to be calculated, including a roll angle, a pitch angle and a yaw angle; set a transformation matrix for the reference values and the measured values by using the selected posture angles; and during the current measurement process, calculate the posture angle according to numerical values of the characteristic quantities of magnetic field indicated by the reference value and the measured value in each direction respectively and the transformation matrix. The transformation matrix $C_t^b$ satisfies the following formula I and formula II:

$$M^b = C_t^b * M^t, \quad \text{formula I}$$

$$C_t^b = \begin{bmatrix} \cos(\theta)*\cos(\varphi) & \cos(\theta)*\sin(\varphi) & -\sin(\theta) \\ \sin(\theta)*\sin(\gamma)*\cos(\varphi) - \sin(\varphi)*\cos(\gamma) & \sin(\theta)*\sin(\gamma)*\sin(\varphi) + \cos(\varphi)*\cos(\gamma) & \cos(\theta)*\sin(\gamma) \\ \sin(\theta)*\cos(\gamma)*\cos(\varphi) + \sin(\varphi)*\sin(\gamma) & \sin(\theta)*\cos(\gamma)*\sin(\varphi) - \cos(\varphi)*\sin(\gamma) & \cos(\theta)*\cos(\gamma) \end{bmatrix}, \quad \text{formula II}$$

in which $M^b$ represents a measured value of the characteristic quantity of magnetic field, $M^t$ represents a reference value of the characteristic quantity of magnetic field, $\gamma$ represents the roll angle, $\theta$ represents the pitch angle, and $\varphi$ represents the yaw angle.

The specific working mode of each unit of the apparatus embodiment of the present invention may refer to the related content of the method embodiment of the present invention, and will not be repeated here.

There is provided a schematic block diagram of hardware configuration of an apparatus for measuring a posture angle of an object provided by yet another embodiment of the present invention. The apparatus comprises a processor, a memory and a sensor. The memory is used for storing instructions and/or programs, wherein the instructions and/or programs stored in the memory may be segmented into one or more modules/units, the one or more modules/units being stored in the memory and executable by the processor to complete the method for measuring the posture angle of the object according to the present invention. The processor is connected with the sensor. The processor reads instructions and/or programs from the memory and executes the instructions and/or programs to implement the functions of the modules/units in the various apparatus embodiments described above. The processor reads and processes data from the sensor to execute the method for measuring the posture angle of the object provided by any of the embodiments described above. The apparatus for measuring the posture angle of the object may be a computing device such as a desktop computer, a notebook, a handheld computer, a wearable device, an unmanned aerial vehicle or a cloud server.

From the above, an embodiment of the present invention provides a novel posture angle or Euler angle measurement scheme using magnetic field characteristics of an object, which is used for calculating a posture angle according to a change of the characteristic quantity of magnetic field of a measured object. This scheme only requires the same type of sensors, and data to be processed is of the same type, thereby significantly reducing the hardware cost and the calculation quantity of data. In addition, the scheme requires no gyroscope or accelerometer. The measured data acquired at the present moment is not associated with the measured data at the previous moment and is absolute data, without the influence from the specific force; and therefore, the posture angle of the object can be accurately measured in real time.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. It is well-known to a person skilled in the art that the implementations of using hardware, using software or using the combination of software and hardware can be equivalent with each other.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. The scope of the present invention is defined by the attached claims.

What is claimed is:

1. A method for measuring a posture angle of an object, comprising the following steps:

arranging a sensor in a measured object, the sensor being used for measuring characteristic quantities of a magnetic field in three dimensional directions;

actuating the sensor at the beginning of the measurement, and acquiring, by using the sensor, current measured values of the characteristic quantities of the magnetic field of the measured object in a carrier coordinate system;

acquiring reference values of the characteristic quantities of the magnetic field of the measured object in a geographic coordinate system; and calculating a current posture angle of the measured object according to numerical values of the characteristic quantities of the magnetic field indicated by the reference value and the measured value in each direction, respectively, wherein the step of calculating the current posture angle of the measured object according to numerical values of the characteristic quantities of the magnetic field indicated by the reference value and the measured value in each direction respectively comprises:

selecting the posture angle to be calculated, including a roll angle, a pitch angle, and a yaw angle;

setting a transformation matrix for the reference values and the measured values by using the selected posture angles; and during the current measurement process, calculating the posture angle according to numerical values of the characteristic quantities of the magnetic field indicated by the reference value and the measured value in each direction respectively and the transformation matrix; and wherein the transformation matrix $C_t^b$ satisfies the following formula:

$$M^b = C_t^b * M^t$$

$$C_t^b = \begin{bmatrix} \cos(\theta)*\cos(\varphi) & \cos(\theta)*\sin(\varphi) & -\sin(\theta) \\ \sin(\theta)*\sin(\gamma)*\cos(\varphi) - \sin(\varphi)*\cos(\gamma) & \sin(\theta)*\sin(\gamma)*\sin(\varphi) + \cos(\varphi)*\cos(\gamma) & \cos(\theta)*\sin(\gamma) \\ \sin(\theta)*\cos(\gamma)*\cos(\varphi) + \sin(\varphi)*\sin(\gamma) & \sin(\theta)*\cos(\gamma)*\sin(\varphi) - \cos(\varphi)*\sin(\gamma) & \cos(\theta)*\cos(\gamma) \end{bmatrix},$$

in which $M^b$ represents a measured value of the characteristic quantity of the magnetic field, $M^t$ represents a reference value of the characteristic quantity of the magnetic field, $\gamma$ represents the roll angle, $\theta$ represents the pitch angle, and $\varphi$ represents the yaw angle.

2. The method according to claim 1, wherein the step of arranging the sensor in the measured object comprises at least one of:

arranging the sensor in the center of mass of the measured object, arranging the sensor at a position away from the center of mass of the measured object for not exceeding a first threshold value; or arranging the sensor at a position away from a magnetic member in the measured object for exceeding a second threshold value.

3. The method according to claim 1, wherein, prior to acquiring, by using the sensor, the current measured values of the characteristic quantities of the magnetic field of the measured object in the carrier coordinate system, the method further comprises calibrating the sensor.

4. The method according to claim 1, wherein the step of acquiring the reference values of the characteristic quantities of magnetic field of the measured object in a geographic coordinate system comprises:

recording reference values of the characteristic quantities of the magnetic field in geographical coordinate systems in different areas to generate a reference data table;

confirming an area where the measured object is currently located firstly when the reference value needs to be acquired; and looking up the reference data table according to the confirmed area, and obtaining the reference value of the characteristic quantity of the confirmed area as the reference value of the measured object.

5. The method according to claim 1, wherein the magnetic field intensity is selected as the characteristic quantity of the magnetic field.

6. The method according to claim 1, wherein the sensor is a magnetometer.

7. The method according to claim 2, wherein, when the measured object is an aircraft, the sensor is set at a position away from a motor of the aircraft for exceeding the second threshold.

8. An apparatus for measuring a posture angle of an object, comprising:
   a measured value acquisition unit configured to actuate a sensor arranged in a measured object at the beginning of the measurement, and acquire, by using the sensor, current measured values of characteristic quantities of a magnetic field of the measured object in a carrier coordinate system, the sensor being used for measuring the characteristic quantities of the magnetic field in three dimensional directions;
   a reference value acquisition unit configured to acquire reference values of the characteristic quantities of the magnetic field of the measured object in a geographic coordinate system; and
   a posture angle calculation unit configured to calculate a current posture angle of the measured object according to numerical values of the characteristic quantities of the magnetic field indicated by the reference value and the measured value in each direction respectively,
   wherein:
      the posture angle calculation unit is configured to:
         select the posture angle to be calculated, including a roll angle, a pitch angle and a yaw angle;
         set a transformation matrix for the reference values and the measured values by using the selected posture angles; and
         during the current measurement process, calculate the posture angle according to numerical values of the characteristic quantities of the magnetic field indicated by the reference value and the measured value in each direction respectively and the transformation matrix; and the transformation matrix $C_t^b$ satisfies the following formula:

$$M^b = C_t^b * M^t,$$

$$C_t^b = \begin{bmatrix} \cos(\theta)*\cos(\varphi) & \cos(\theta)*\sin(\varphi) & -\sin(\theta) \\ \sin(\theta)*\sin(\gamma)*\cos(\varphi)- \sin(\varphi)*\cos(\gamma) & \sin(\theta)*\sin(\gamma)*\sin(\varphi)+ \cos(\varphi)*\cos(\gamma) & \cos(\theta)*\sin(\gamma) \\ \sin(\theta)*\cos(\gamma)*\cos(\varphi)+ \sin(\varphi)*\sin(\gamma) & \sin(\theta)*\cos(\gamma)*\sin(\varphi)- \cos(\varphi)*\sin(\gamma) & \cos(\theta)*\cos(\gamma) \end{bmatrix},$$

in which $M^b$ represents a measured value of the characteristic quantity of the magnetic field, $M^t$ represents a reference value of the characteristic quantity of the magnetic field, $\gamma$ represents the roll angle, $\theta$ represents the pitch angle, and $\varphi$ represents the yaw angle.

9. The apparatus according to claim 8, wherein the sensor arranged in the measured object is located in at least one of:
   the center of mass of the measured object, or the
   in a position such that a distance from the sensor arranged in the measured object to the center of mass of the measured object does not exceed a first threshold value; or
   a position away from a magnetic member in the measured object such that a second threshold value is exceeded.

10. The apparatus according to claim 8, further comprising a calibration unit configured to calibrate the sensor.

11. The apparatus according to claim 8, wherein the reference value acquisition unit is configured to:
   record reference values of the characteristic quantities in geographical coordinate systems in different areas to generate a reference data table;
   confirm an area where the measured object is currently located firstly when the reference value needs to be acquired;
   look up the reference data table according to the confirmed area, and
   obtain the reference value of the characteristic quantity of the confirmed area as the reference value of the measured object.

12. The apparatus according to claim 8, wherein the characteristic quantity of the magnetic field is magnetic field intensity.

13. The apparatus according to claim 8, wherein the sensor is a magnetometer.

14. The apparatus according to claim 9, wherein, when the measured object is an aircraft, the distance from the sensor to a motor of the aircraft is larger than the second threshold.

* * * * *